(12) United States Patent
Boniardi et al.

(10) Patent No.: US 10,636,966 B2
(45) Date of Patent: Apr. 28, 2020

(54) THERMALLY OPTIMIZED PHASE CHANGE MEMORY CELLS AND METHODS OF FABRICATING THE SAME

(71) Applicant: Micron Technology, Inc., Boise, ID (US)

(72) Inventors: Mattia Boniardi, Cormano (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/390,939

(22) Filed: Apr. 22, 2019

(65) Prior Publication Data

US 2019/0252608 A1    Aug. 15, 2019

Related U.S. Application Data

(60) Continuation of application No. 15/994,815, filed on May 31, 2018, now Pat. No. 10,305,036, which is a continuation of application No. 15/607,095, filed on May 26, 2017, now Pat. No. 10,008,668, which is a continuation of application No. 14/861,259, filed on Sep. 22, 2015, now Pat. No. 9,698,346, which is a
(Continued)

(51) Int. Cl.
*H01L 45/00* (2006.01)
*H01L 27/24* (2006.01)

(52) U.S. Cl.
CPC ...... *H01L 45/1293* (2013.01); *H01L 27/2427* (2013.01); *H01L 27/2445* (2013.01); *H01L 27/2463* (2013.01); *H01L 45/06* (2013.01); *H01L 45/1233* (2013.01); *H01L 45/1253* (2013.01); *H01L 45/141* (2013.01); *H01L 45/144* (2013.01); *H01L 45/16* (2013.01); *H01L 45/1608* (2013.01)

(58) Field of Classification Search
None
See application file for complete search history.

(56) References Cited

U.S. PATENT DOCUMENTS 5,831,276 A * 11/1998 Gonzalez ............ H01L 27/1021
                                                            257/3
6,015,977 A *  1/2000 Zahorik ............... H01L 27/101
                                                            257/4
(Continued)

FOREIGN PATENT DOCUMENTS

CN       102034928 A      4/2011

OTHER PUBLICATIONS

Clarke, "Materials selection Guidelines for Low thermal Conductivity Thermal Barrie Coatings," Surface and Coatings Technology, vol. 163-164, 2003, 8pgs., Elsevier Science B.V.
(Continued)

*Primary Examiner* — Thien F Tran
(74) *Attorney, Agent, or Firm* — Holland & Hart LLP (57) ABSTRACT

A thermally optimized phase change memory cell includes a phase change material element disposed between first and second electrodes. The second electrode includes a thermally insulating region having a first thermal resistivity over the first electrode and a metallic contact region interposed between the phase change material element and the thermally insulating region, where the metallic contact layer has a second thermal resistivity lower than the first thermal resistivity.

19 Claims, 4 Drawing Sheets

Related U.S. Application Data division of application No. 13/908,707, filed on Jun. 3, 2013, now Pat. No. 9,153,777.

(56) References Cited

U.S. PATENT DOCUMENTS

| | | | |
|---|---|---|---|
| 6,795,338 | B2 | 9/2004 | Parkinson et al. |
| 6,897,467 | B2 | 5/2005 | Doan et al. |
| 7,102,151 | B2 | 9/2006 | Reinberg et al. |
| 7,391,050 | B2 | 6/2008 | Happ |
| 7,417,245 | B2 | 8/2008 | Happ et al. |
| 7,936,593 | B2 | 5/2011 | Savransky |
| 8,404,514 | B2 | 3/2013 | Lee et al. |
| 8,526,225 | B2 | 9/2013 | Goux et al. |
| 9,153,777 | B2 | 10/2015 | Boniardi et al. |
| 10,008,668 | B2 | 6/2018 | Boniardi et al. |
| 2003/0127669 | A1* | 7/2003 | Doan .................. H01L 27/2463 257/246 |
| 2008/0137400 | A1 | 6/2008 | Chen et al. |
| 2014/0091274 | A1* | 4/2014 | Kim ..................... H01L 45/145 257/4 |

OTHER PUBLICATIONS

ISA/EPO, International Search Report and Written Opinion of the International Searching Authority, Int'l Appl. No. wi, Aug. 29, 2014, Korean Intellectual Property Office, Seo-gu, Daejeon Metropolitan City, Republic of Korea.

Lee et al., "Programming Disturbance and Cell Scaling in Phase Change Memory: For up to 16nm Based $4F^2$ Cell," 2010 Symposium on VLSI Technology, Jun. 15-17, 2010, 2pgs., IEEE.

Servalli, "A 45nm Generation Phase Change Memory Technology," Electron Devices Meeting (IEDM) Dec. 7-9, 2009, 4 pgs., IEEE.

\* cited by examiner

THERMALLY OPTIMIZED PHASE CHANGE MEMORY CELLS AND METHODS OF FABRICATING THE SAME

CROSS REFERENCE TO RELATED APPLICATIONS

The present application for patent is a continuation of U.S. patent application Ser. No. 15/994,815 by Boniardi et al., entitled "Thermally Optimized Phase Change Memory Cells and Methods of Fabricating the Same," filed May 31, 2018, which is a continuation of U.S. patent application Ser. No. 15/607,095 by Boniardi et al., entitled "Thermally Optimized Phase Change Memory Cells and Methods of Fabricating the Same," filed May 26, 2017, which is a continuation of U.S. patent application Ser. No. 14/861,259 by Boniardi et al., entitled "Thermally Optimized Phase Change Memory Cells and Methods of Fabricating the Same," filed Sep. 22, 2015, which is a divisional of U.S. patent application Ser. No. 13/908,707 by Boniardi et al., entitled "Thermally Optimized Phase Change Memory Cells and Methods of Fabricating the Same," filed Jun. 3, 2013, assigned to the assignee hereof, and each of which is expressly incorporated by reference herein.

FIELD

Subject matter disclosed herein relates to devices in integrated circuits generally, and in particular, to devices incorporating chalcogenide materials.

BACKGROUND

Devices incorporating phase change materials, e.g., chalcogenide materials, such as for example switches and storage elements, may be found in a wide range of electronic devices. For example, devices incorporating phase change materials may be used in computers, digital cameras, cellular telephones, personal digital assistants, etc. Factors that a system designer may consider in determining whether and how to incorporate phase change materials for a particular application may include, physical size, storage density, scalability, operating voltages and currents, read/write speed, read/write throughput, transmission rate, and/or power consumption, for example. Other example factors that may be of interest to a system designer include cost of manufacture, and/or ease of manufacture.

DETAILED DESCRIPTION OF EMBODIMENTS

Devices incorporating phase change materials, e.g. memory devices, may be found in a wide range of electronic devices. For example, devices incorporating phase change materials may be used in computers, digital cameras, cellular telephones, personal digital assistants, etc. Factors related to devices incorporating phase change materials that a system designer may consider in determining the device's suitability for a particular application may include, physical size, storage density, scalability, operating voltages and currents, read/write speed, read/write throughput, transmission rate, and/or power consumption, for example. Other example factors that may be of interest to a system designer include cost of manufacture, and/or ease of manufacture.

In particular, memory devices incorporating phase change materials can provide several performance advantages over other memory devices, such as flash memory devices and dynamic random access memory devices (DRAM). For example, some phase change memory devices can be non-volatile; i.e., physical and electrical states of the memory devices change do not change substantially over a retention time (e.g., longer than one year) without any external power supplied thereto. In addition, some phase change memory devices can provide fast read and write access time (e.g., faster than 10 nanoseconds) and/or high read and write access bandwidth (e.g., greater than 100 megabits per second). In addition, some phase change memory device can be arranged in a very high density memory array, e.g., a cross-point array having greater than 1 million cells in the smallest memory array unit connected with local metallization.

Performance of a phase change memory device with respect to above described characteristics depends on many factors. In particular, having good thermal isolation of the phase change material element within a memory device and low electrical resistances between the phase change material element and interfacing electrodes can reduce the energy required to program the device, as well as device-to-device thermal disturbance (i.e., thermal cross-talk). In addition, having low electrical resistance between the phase change material and the interfacing electrodes can also improve the signal-to-noise ratio of the memory device during a read operation. However, providing good thermal isolation can result in a tradeoff with low interfacial resistance, and vice versa. For example, interfacing electrodes often comprise metals, which can form low electrical resistance contacts with the phase change material element. However, such low contact materials tend to also be good thermal conductors, i.e., provide poor thermal isolation. Thus, there is a need for a thermally confined phase change memory device having a phase change material element having low electrical resistance and good thermal isolation. While embodiments are described herein with respect to memory arrays, it will be understood that a thermally confined phase change memory device with reduced interfacial resistance as described herein can also have application outside the memory array context.

Figure 1:
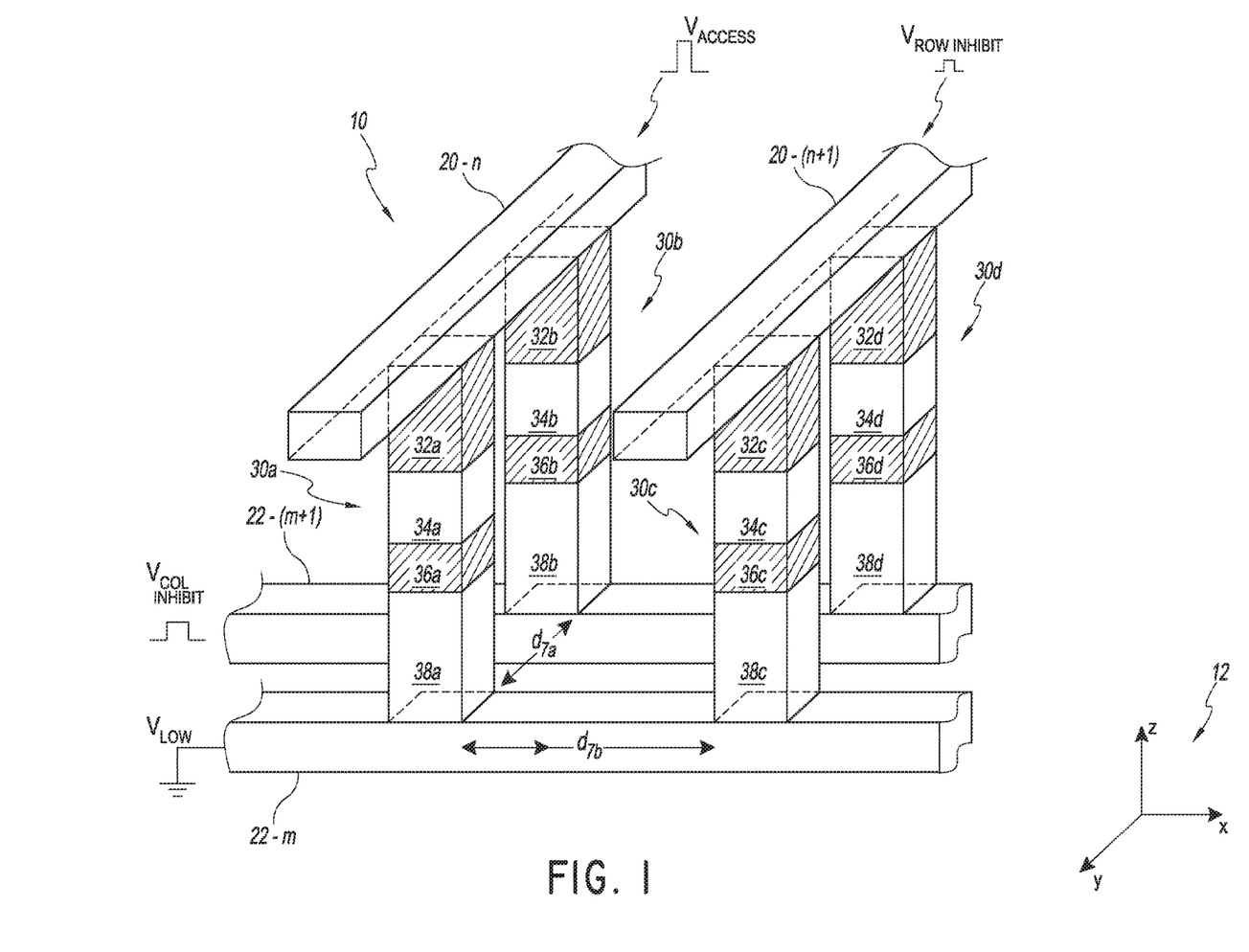
FIG. 1 is a three-dimensional illustration depicting a cross-point memory array according one embodiment.

FIG. 1 shows a portion of a cross-point memory array 10 having N×M phase change memory cells according to one embodiment of the present invention. The cross-point memory array 10 comprises first through Nth column lines 20-1, 20-2, . . . , and 2-N, first through Mth row lines 22-1, 22-2, ..., and 22-M, and a plurality of memory cells disposed at at least a subset of the intersections formed by first through Nth column lines and first through Mth row lines.

The cross-point memory array 10 includes access lines in the form of first through Nth column lines 20-1, 20-2, ..., and 20-N, which may be referred to digit lines, e.g., bit lines (BLs). The cross-point array 10 also includes crossing access lines in the form of first through Mth row lines 22-1, 22-2, ..., and 22-M, which may be referred to as word lines (WLs). References to column lines and row lines, as well as their alternative designations, are interchangeable. The coordinate axis marker 12 in this embodiment indicates that first through Nth column lines 20-1, 20-2, ..., and 20-N are extend along a y-direction (also referred to herein as a column direction) and first through Mth row lines 22-1, 22-2, ..., and 22-M are oriented in a x-direction (also referred to herein as a row direction). As illustrated, first through Nth column lines 20-1, 20-2, ..., and 20-N are substantially parallel to each other. Similarly, the first through Mth row lines 22-1, 22-2, ..., and 22-M are substantially parallel to each other. However, other embodiments are possible, and word lines and digit lines can have non-perpendicular orientations. Typically row lines are parallel to one another and column lines are parallel to one another at an angle such that they cross with the row lines. As used herein, the term "substantially" intends that the modified characteristic needs not be absolute, but is close enough so as to achieve the advantages of the characteristic.

The cross-point memory array 10 further includes a plurality of memory cells disposed at at least a subset of the intersections formed by first through Nth column lines and first through Mth row lines. In this configuration, the cross-point memory array 10 includes up to N×M memory cells. In FIG. 1, however, for clarity, only four phase change memory cells are shown. As illustrated, the four phase change memory cells in the example of FIG. 1 include first through fourth memory cells 30a-d at intersections of nth column line 20-n and mth row line 22-m, nth column line 20-n and (m+1)th row line 22-(m+1), (n+1)th column line 20-(n+1) and mth row line 22-m, and (n+1)th column line 20-(n+1) and (m+1)th row line 22-(m+1), respectively. In this example, it will be understood that each one of the memory cells 30a-d has two nearest neighboring cells in the x-direction, two nearest neighboring cells in the y-direction, and four next nearest neighboring cells in the diagonal direction between the x-direction and the y-direction. For example, in the x-direction, the first cell 30a has two nearest neighboring cells, namely a fifth memory cell 30e (not shown) at the intersection of (n−1)th column line 20-(n−1) and mth row line 22-m and the third memory cell 30c at the intersection of (n+1)th column line 20-(n+1) and mth row line 22-m. In addition, the y-direction, the first cell 30a has two nearest neighboring cells, namely an eighth memory cell 30h (not shown) at the intersection of nth column line 20-n and (m−1)th row line 22-(m−1) and the second memory cell 30b at the intersection of nth column line 20-n and (m+1)th row line 22-(m+1). In addition, in the two diagonal directions, the first cell 30a has four next nearest neighboring cells, namely the fourth memory cell 30d at the intersection of (n+1)th column line 20-(n+1) and (m+1)th row line 22-(m+1), a sixth memory cell 30f (not shown) at the intersection of (n−1)th column line 20-(n−1) and (m+1)th row line 22-(m+1), a seventh memory cell 30g (not shown) at the intersection of (n−1)th column line 20-(n−1) and (m−1)th row line 22-(m−1), and a ninth memory cell 30i (not shown) at the intersection of (n+1)th column line 20-(n+1) and (m−1)th row line 22-(m−1).

In one embodiment, column lines may comprise a suitable conductive and/or semi conductive material including n-doped poly silicon, p-doped poly silicon, metals including Al, Cu, and W, conductive metal nitrides including TiN, TaN, and TaCN. In addition, top and bottom electrodes, described below, in various embodiments may comprise suitable conductive materials including doped semiconductors, such as n-doped poly silicon and p-doped poly silicon, and/or metallic materials, such as metals including C, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides, and titanium silicides; and conductive metal oxides including $RuO_2$. In some embodiments, row lines may also comprise same or similar conductive and/or semiconductive materials as column lines.

Each of the memory cells 30a-d in FIG. 1 according to one embodiment is configured in a stack configuration to include first through fourth selector nodes 38a-d on one of mth and (m+1)th row lines 22-m and 22-(m+1), first through fourth bottom electrodes 36a-d on selector nodes 38a-d, first through fourth storage nodes 34a-d on bottom electrodes 36a-d, and first through fourth top electrodes 32a-d on the storage nodes 34a-d. Other embodiments of a stack configuration are possible. For example, the positions of storage nodes 34a-d and selector nodes 38a-d within a stack configuration may be interchanged with one another.

In one embodiment, each of the storage nodes 34a-d includes a phase change material. Suitable phase change materials include chalcogenide compositions such as an alloy including at least two of the elements within the indium(In)-antimony(Sb)-tellurium(Te) (IST) alloy system, e.g., $In_2Sb_2Te_5$, $In_1Sb_2Te_4$, $In_1Sb_4Te_7$, etc., an alloy including at least two of the elements within the germanium(Ge)-antimony(Sb)-tellurium(Te) (GST) alloy system, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, etc., among other chalcogenide alloy systems. The hyphenated chemical composition notation, as used herein, indicates the elements included in a particular mixture or compound, and is intended to represent all stoichiometries involving the indicated elements. Other chalcogenide alloy systems that can be used in phase change storage nodes include Ge—Te, In—Se, Sb—Te, Ga—Sb, In—Sb, As—Te, Al—Te, In—Ge—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example.

When included in the memory cells 30a-d, selector nodes 38a-d may be electrically coupled to storage nodes 34a-d through bottom electrodes 36a-d on one side and electrically connected to row lines 22 on another side to form two terminal selector devices.

According to one embodiment, when selector nodes 38a-d comprise a chalcogenide material, the two terminal selector device can be an Ovonic Threshold Switch (OTS). In this embodiment, a selector node may include a chalcogenide composition including any one of the chalcogenide alloy systems described above for a storage node. In addition, the selector node may further comprise an element to suppress crystallization, such as arsenic (As). When added, an element such as As suppresses crystallization by inhibiting any non-transitory nucleation and/or growth of the alloy. Accordingly, a selector node 38a-d may be configured to switch to a conductive state when a potential exceeding a threshold voltage is applied across the selector node 38a-d. In addition, the conductive state can be maintained while a sufficient holding current is maintained across the selector node. Examples include Te—As—Ge—Si, Ge—Te—Pb, Ge—Se—Te, Al—As—Te, Se—As—Ge—Si, Se—As—Ge—C, Se—Te—Ge—Si, Ge—Sb—Te—Se, Ge—Bi—Te—Se, Ge—As—Sb—Se, Ge—As—Bi—Te, and Ge—As—Bi—Se, among others.

According to another embodiment, selector nodes 38a-d can form parts of semiconductor-based selector devices such as bipolar junction transistors (BJT). For example, in one embodiment, each one of selector nodes 38a-d can be a p-type semiconductor to form a p-type emitter region of a PNP BJT. Each one of selector nodes 38a-d can be connected to one of row lines 22, which can be an n-type semiconductor forming an n-type base region of the PNP BJTs. Each one of row lines 22 can in turn be disposed on a p-type semiconductor, e.g., p-type substrate, forming a p-type collector region of the PNP BJT. In the embodiment of FIG. 1, selector nodes 38a and 38c forming p-type emitter regions are connected by the row line 22-m forming a first common base region. The first common base region can be contacted to an upper metal level at a first base contact (not shown) farther along the x-direction. Similarly, selector nodes 38b and 38d forming p-type emitter regions are connected by the row line 22-(m+1) forming a second common base region. The second common base can be contacted to an upper metal level at a second base contact (not shown) farther along the x-direction. A person skilled in the art will understand that each of the row lines 22 can form a common base region connecting a suitable number of emitter regions. For example, the number of emitter regions in contact with a common base region can be 4, 8, 16, 32, 64, or more. A person skilled in the art will also understand that by analogy to a PNP BJT, an NPN BJT can also be formed in a similar fashion. Additionally, in other embodiments, p-type emitter regions are not connected to common base regions.

In one embodiment, any one of the memory cells disposed at an intersection formed by any one of first through Nth column lines 20-1, 20-2, . . . , and 20-N and first through Mth row lines 22-1, 22-2, . . . , 22-M may have a resistance state that may be a relatively high resistance state, also known as the RESET state, which can represent the state of a phase change material in a storage node 34 that includes a substantial amorphous region. Similarly, any one of the memory cells may have a resistance state that may be a relatively low resistance state, also known as the SET state, which can represent the state of a phase change material in a storage node 34 that is substantially crystalline. Under this implementation, high and low resistance states may correspond to the "1" state and a "0" state in a single bit-per-cell memory system. However, the states "1" and "0" as they relate to high and low resistance states may be used interchangeably to mean the opposite. For example, a high resistance state may be referred to as a "0" state, and a low resistance state may be referred to as a "1" state.

In other embodiments, any one of the memory cells disposed at an intersection formed by any one of the column lines and row lines may have a resistance state that may be an intermediate resistance state. For example, any one of the memory cells may have a resistance state that is any one of first, second, third, and fourth resistance states, wherein the first resistance state is more resistive than the second resistance state, the second resistive state is more resistive than the third resistive state, and the third restive state is more resistive than the fourth state. Under this implementation, first, second, third, and fourth resistance states may correspond to the "11," "10," "01", and "00" states in a two bits-per-cell memory system. Yet other embodiments are possible, where first through eighth resistance states represent the states in a three-bits-per cell memory system, and where first through sixteenth resistance states represent the states in a four-bits-per cell memory system.

In one embodiment, each one of the memory cells disposed at an intersection formed by any one of first through Nth column lines 20-1, 20-2, . . . , and 20-N and any one of first through Mth row lines 22-1, 22-2, . . . , and 22-M may be accessed by an access operation. An access operation may be a write access operation, an erase access operation, or a read access operation. A write access operation, otherwise known as the program operation or a RESET operation, changes the resistance state of the memory cell from a relatively low resistance state to a relatively high resistance state. Similarly, an erase operation, otherwise known as the SET operation, changes the resistance state of the memory cell from a relatively high resistance state to a relatively low resistance state. However, the terms "write" and "erase" as they relate to RESET and SET operations may be used interchangeably to mean the opposite. For example, an erase operation may be referred to as a SET operation, and a program or write operation may be referred to as a RESET operation.

In an embodiment, each one of the memory cells disposed at an intersection formed by any of the column lines and row lines may be accessed individually in a bit-addressable access mode. In a bit-addressable access mode, a memory to be accessed may be a memory cell 30a located at an intersection formed by a selected nth column line 20-n and a selected mth row line 22-m. An access voltage $V_{ACCESS}$, which may be a SET access voltage $V_{SET}$, a RESET access voltage $V_{RESET}$, or a read access voltage $V_{READ}$, may be applied across the memory cell 30a of this example by applying the access voltage across the selected nth column line 20-n and the selected mth row line 22-m.

In one embodiment, a memory cell such as the memory cell 30a at the intersection of the selected column line 20-n and the selected row line 22-m accessed while preventing the remaining cells from getting accessed. This can be achieved by applying a voltage $V_{ACCESS}$ across the memory cell 30a while allowing for voltages substantially lower than $V_{ACCESS}$ to be applied across the rest of the cells, for example memory cells 30b-d. In one embodiment, this is obtained by applying $V_{ACCESS}$ to one end of the selected column line (nth column line 20-n in this example) while keeping one end of the selected row line (mth row line 22-m in this example) at a low voltage $V_{LOW}$, which may be at ground potential. Concurrently, a voltage $V_{COL\ INHIBIT}$ is applied across all remaining column lines (first through 20-(n−1) and 20-(n+1) through 20-N column lines in this example). In addition, a voltage $V_{ROW\ INHIBIT}$ is applied across all remaining row lines (first through 20-(m−1) and 20¬(m+1) through 20-M row lines in this example). Under this configuration, a voltage of about $V_{ACCESS}$ is dropped between the nth column line 20-n and the mth row line 22-m across the memory cell 30a (which may be referred to hereinafter as a "target cell"). In addition, a voltage of about $(V_{ACCESS}-V_{ROW\ INHIBIT})$ is dropped across inhibited cells such as the memory cell 30b along the selected nth column line 20-n (which may be referred to hereinafter as "A-type cells"), and a voltage of about $V_{COL\ INHIBIT}$ is dropped across inhibited cell such as the memory cell 30c along the selected mth row line 20-m (which may be referred to hereinafter as "B-type cells"). In addition, a voltage approximately equal to ($V_{COL\ INHIBIT}-V_{ROW\ INHIBIT}$) is dropped across all remaining deselected cells such as the memory cell 30d (which may be referred to hereinafter as "C-type cells").

In one particular embodiment, $V_{ROW\ INHIBIT}$ and $V_{COL\ INHIBIT}$ is selected to be a voltage substantially equal to $V_{ACCESS}/2$. In this implementation, a voltage substantially equal to $V_{ACCESS}/2$ is dropped across A-type cells (e.g. the memory cell 32b) and across B-type cells (e.g. the memory cell 30c) while a voltage substantially equal to zero is dropped across C-type cells (e.g. the memory cell 30d). This embodiment may be utilized, for example, when the selector included in the memory cell is an Ovonic Threshold Switch (OTS).

In another particular embodiment, $V_{ROW\ INHIBIT}$ is selected to be at $V_{ACCESS}$ and $V_{COL\ INHIBIT}$ is selected to be at $V_{LOW}$ (which may be at ground potential). In this implementation, a voltage substantially equal to zero is dropped across type A cells (e.g. the memory cell 32b) and across type B cells (e.g. the memory cell 30c) while a voltage substantially equal to $-V_{ACCESS}$ is dropped across C-type cells (e.g. the memory cell 30d). This embodiment may be utilized, for example, when the selector included in the memory cell is a bipolar junction transistor (BJT).

Other embodiments are possible. For example, a voltage of $V_{ACCESS}$ across the target cell can be obtained by applying a suitable positive fraction of $V_{ACCESS}$ such as $+\frac{1}{2} V_{ACCESS}$ to one end of the selected column while applying a suitable negative fraction of $V_{ACCESS}$ such as $-\frac{1}{2} V_{ACCESS}$ is applied to one end of the selected row. Similarly, suitable fractions of $V_{ACCESS}$ can be chosen as $V_{ROW\ INHIBIT}$ and $V_{COL\ INHIBIT}$. A person skilled in the art will recognize that choosing a bias scheme depends on many factors, such as the selector device type, an overall cell current-voltage (IV) characteristics, number of columns, number of rows, and the overall array size, among others. A person skilled in the art will also recognize that the actual voltages that similarly situated cells receive may deviate from the voltage applied at one of the ends of a column or a row due to various parasitic resistances and capacitances to which a particular cell may be subject to under a particular access condition.

Figure 2A:
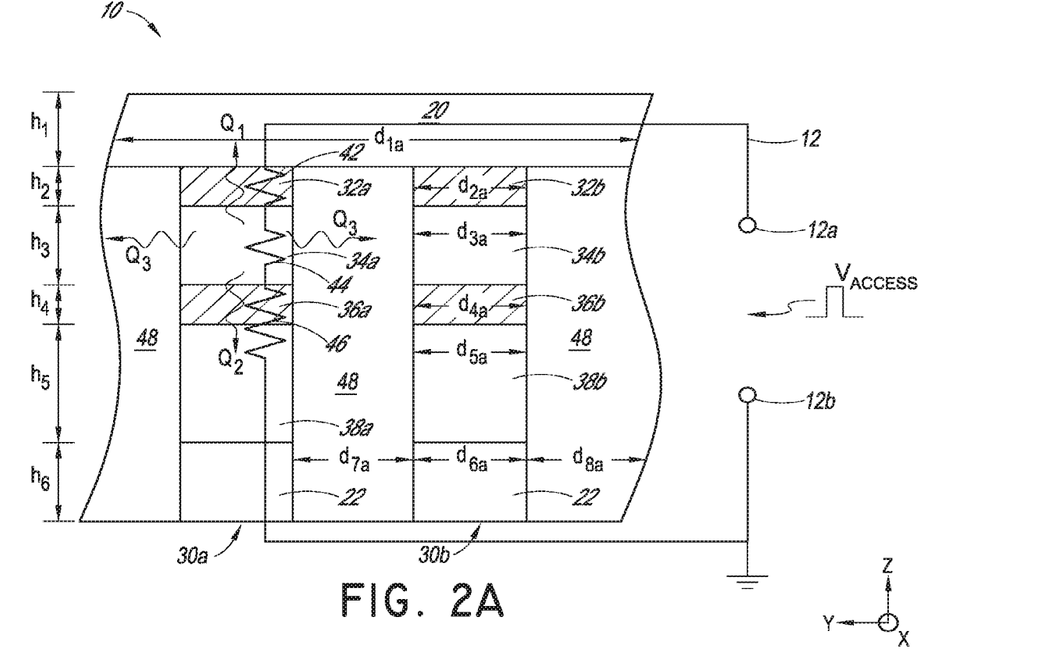
FIG. 2A is an illustration depicting a cross-section of a phase change memory cell taken along a column line according to one embodiment.
Figure 2B:
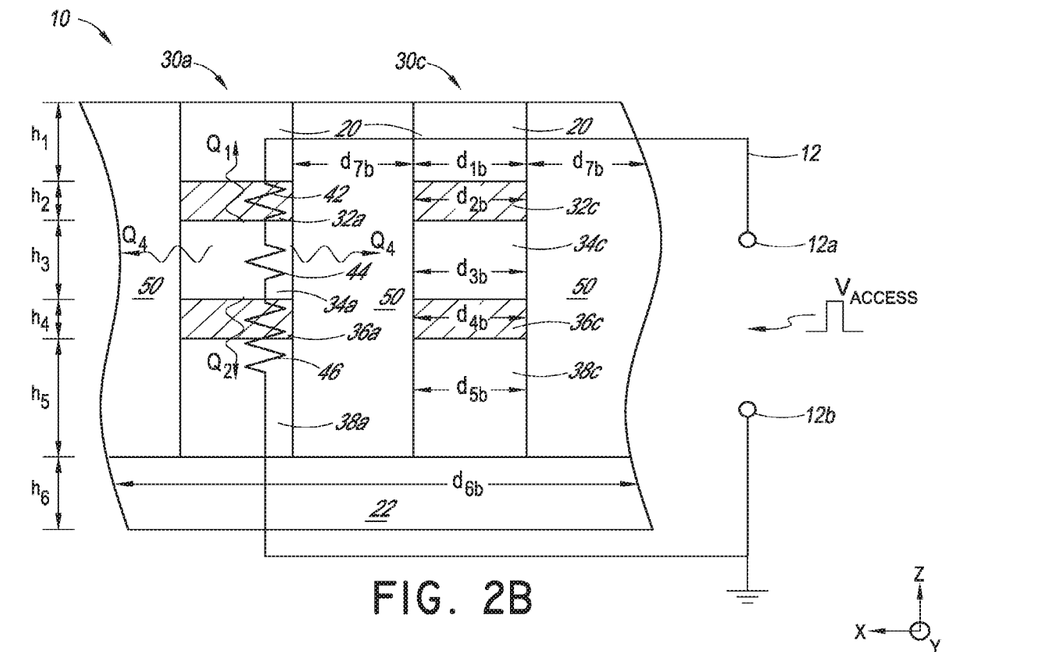
FIG. 2B is an illustration depicting a cross-section of a phase change memory cell taken along a row line according to one embodiment.

FIGS. 2A and 2B illustrate cross-sectional views of the cross point memory array 10 of FIG. 1 viewed in a direction parallel to the x-direction and the y-direction, respectively. The cross sectional views are annotated with circuit representations demonstrating relevant resistive elements during an access operation of a target cell 30a as described above.

In FIG. 2A, for clarity, only two phase change memory cells are shown along a column line 20 in the y-direction. As illustrated, the two phase change memory cells include the first and second memory cells 30a and 30b along a column line 20. As discussed in FIG. 1, each of the first and second memory cells 30a and 30b is configured in a stack configuration to include first and second selector nodes 38a and 38b on a row lines 22, first and second bottom electrodes 36a and 36b on selector nodes 38a and 38b, first and second storage nodes 34a and 34b on bottom electrodes 36a and 36b, and first and second top electrodes 32a and 32b on storage nodes 34a and 34b.

Similarly, in FIG. 2B, for clarity, only two phase change memory cells are shown along a row line 22 in the x-direction. As illustrated, the two phase change memory cells include the first and third memory cells 30a and 30c along a row line 22. As discussed in FIG. 1, each of the memory cells 30a and 30c is configured in a stack configuration to include first and third selector nodes 38a and 38c on a row line 22, first and third bottom electrodes 36a and 36c on selector nodes 38a and 38c, first and third storage nodes 34a and 34c on bottom electrodes 36a and 36c, and first and third top electrodes 32a and 32c on storage nodes storage nodes 34a and 34c.

In addition, according to the illustrated embodiment in FIGS. 2A and 2B, adjacent memory cells in the y-direction can be interposed by inter-column dielectric regions 48 and adjacent memory cells in the x-direction can be interposed by inter-row dielectric regions 50. The inter-column dielectric regions 48 and inter-row dielectric regions 40 can be filled with suitable insulating material such as $SiO_2$ and $Si_3N_4$. Under these configurations, storage nodes are surrounded in x and y directions by dielectrics and the array process architecture may be referred to as fully-confined array architecture. When selector nodes 38a-d include emitter regions of BJTs, the inter-column dielectric regions 48 and inter-row dielectric regions 50 adjacent to the selector nodes 38a-d can include shallow trench isolation dielectrics.

In the fully-confined array architecture of the cross-point memory array 10 in FIGS. 2A and 2B, when accessed in a bit-addressable access mode, the memory cell 30a to be accessed (i.e., the target memory cell) may be memory cell 30a located at an intersection formed by an nth column 20-n and an mth row 22-m. An access voltage $V_{ACCESS}$, which may be a SET access voltage $V_{SET}$, a RESET access voltage $V_{RESET}$, or a read access voltage $V_{READ}$, may be applied across the target cell of this example by applying the access voltage $V_{ACCESS}$ across the first terminal 12a and a second terminal 12b of an access circuit path 12. First and second terminals 12a and 12b can represent ends of the nth column 20-n and the mth row 22-m. $V_{ACCESS}$ and the associated current $I_{ACCESS}$ will result in energy dissipation at various points along the access circuit path 12.

The access circuit path 12 includes first through third resistors 42, 44, and 46 connected in electrical series between first and second terminals 12a and 12b. When the storage node 34a is in the SET state, the first through third resistors 42, 44, and 46 can have first through third low resistance state (LRS) resistances $R_{LRS1}$, $R_{LRS2}$, and $R_{LRS3}$. When the storage node 34a is in the RESET state, the first through third resistors 42, 44, and 46 can have first through third high resistance state (HRS) resistances $R_{HRS1}$, $R_{HRS2}$, and $R_{HRS3}$. Contributions to LRS resistances $R_{LRS1}$, $R_{LRS2}$, and $R_{LRS3}$ and HRS resistances $R_{HRS1}$, $R_{LRS2}$, and $R_{LRS3}$ can originate from various regions across the first memory cell 30a. For example, regions that contribute to $R_{LRS1}$ and $R_{HRS1}$ can include a bulk material of the top electrode 32a and a first interface between the top electrode 32a and the storage node 34a. Additionally, regions that contribute to $R_{LRS2}$ and $R_{HRS2}$ can include a bulk material of the storage node 34a. Additionally, regions that contribute to $R_{LRS3}$ and $R_{HRS3}$ can include a second interface between the storage node 34a and the bottom electrode 36a and a bulk material of the bottom electrode 36a. It is to be understood that while other regions may also contribute substantially to the overall resistance between the first and second terminals 12a and 12b, only first through third resistors 42, 44, and 46 are represented in the access circuit path 12 for clarity. In addition, other circuit paths can exist, for example, through the second memory cell 30b, which are not shown nor discussed for clarity.

As a person skilled in the art will understand, in some implementations, an $I_{ON}/I_{OFF}$ ratio can be an important consideration in designing a memory cell. An ON/OFF ratio can be proportional to the ratio $(R_{HRS1}+R_{HRS2}+R_{HRS3})$ $(R_{LRS1}+R_{LRS2}+R_{LRS3})$. When $R_{HRS2}>>R_{HRS1}+R_{HRS3}$ and $R_{LRS2}>>R_{LRS1}+R_{LRS3}$, the ON/OFF ratio can be dominated by the ratio $R_{HRS2}/R_{LRS2}$. Under this circumstance, the ON/OFF ratio can be desirably dominated by the resistance ratio of the bulk resistances of the storage node 34a in RESET and SET states. On the other hand, when $R_{HRS2}<<R_{HRS1}+R_{HRS3}$ and $R_{LRS2}<<R_{LRS1}+R_{LRS3}$, the ON/OFF ratio can be relatively independent of the ratio $R_{HRS2}/R_{LRS2}$. Under this circumstance, the ON/OFF ratio can be undesirably dominated by the resistance values of the first and second interfaces between the storage node 34 and the top and bottom electrodes 32a and 36a and/or the resistance values of the bulk materials of the top and bottom electrodes 32a and 36a. Thus, from an ON/OFF ratio point of view, relatively low LRS and HRS resistances $R_{LRS1}$, $R_{LRS3}$, $R_{HRS1}$, and $R_{HRS3}$ of the first and third resistors 42 and 46 and relatively high LRS and HRS resistances $R_{LRS2}$ and $R_{HRS2}$ of the second resistor 44 can be preferred.

The energy efficiency of SET and RESET operations can also be proportional to heats generated at various regions of the memory cell. In some implementations, it may be desirable to have self-heating of the storage node dominate over heats generated in other regions. From this standpoint, it may be desirable to have $R_{HRS2}>>R_{HRS1}+R_{HRS3}$ and $R_{LRS2}>>R_{LRS1}+R_{LRS3}$. When a voltage $V_{ACCESS}$ is applied between the first and second terminals 12a and 12b of the access circuit path 12, voltages proportional to respective LRS and FIRS resistances can drop across first, second, and third resistors 42, 44, and 46. For example, when $V_{ACCESS}=V_{RESET}$ is applied between the first and second terminals 12a and 12b, first, second, and third voltages $V_{RESET1}$, $V_{RESET2}$, and $V_{RESET3}$ can drop across first, second, and third resistors 42, 44, and 46, respectively. The resulting current $I_{RESET}=V_{RESET}/(R_{LRS1}+R_{LRS2}+R_{LRS3})$ can result in generation of first, second, and third RESET heats $Q_{RST1}=I_{RESET}^2R_{LRS1}$ and $Q_{RST2}=I_{RESET}^2R_{LRS2}$, and $Q_{RST3}=I_{RESET}^2R_{LRS3}$, respectively. Thus, for maximum energy efficiency of the RESET operation, it may be desirable to have $R_{LRS2}>>R_{LRS1}+R_{LRS3}$ such that more of the access energy is spent on self-heating of the storage node 34a compared to heating the interfaces.

Similarly, when $V_{ACCESS}=V_{SET}$ is applied between the first and second terminals 12a and 12b, first, second, and third voltages $V_{SET1}$, $V_{SET2}$, and $V_{SET3}$ can drop across first, second, and third resistors 42, 44, and 46, respectively. In addition, the resulting current $I_{SET}=V_{SET}/(R_{HRS1}+R_{HRS2}+R_{HRS3})$ can result in generation of first, second, and third SET heats $Q_{SET1}=I_{SET}^2R_{HRS1}$ and $Q_{SET2}=I_{SET}^2R_{HRS2}$, and $Q_{SET3}=I_{SET}^2R_{HRS3}$, respectively. Thus, for maximum energy efficiency of the SET operation, it may also be desirable to have $R_{HRS2}>>R_{HRS1}+R_{HRS3}$ such that more of the access energy is spent on self-heating of the storage node 34a compared to the interfaces.

The energy efficiencies of SET and RESET operations can also be proportional to confinement of heat in the storage node during SET and RESET operations. Accordingly, the performance of a memory cell can be improved minimizing heat loss from the storage node. As illustrated in FIGS. 2A and 2B, there can be heat loss in six directions. A first heat $Q_1$ can be lost from the storage node 34a in the z-direction towards the top electrode 32a. A second heat $Q_2$ can be lost from the storage node 34a in the z-direction towards the bottom electrode 36a. A third heat $Q_3$ can be lost from the storage node 34a in opposite y directions towards adjacent storage nodes 34b and 34h (not shown). A fourth heat $Q_4$ can be lost from the storage node 34a in opposite x-directions towards adjacent storage nodes 34c and 34e (not shown).

First through fourth lost heats $Q_1$-$Q_4$ can depend on many factors. Generally, one-dimensional heat flux can be expressed as being proportional to K(dT/dx), where dT/dx is the temperature gradient one dimension in the direction of the heat flow and κ is the thermal conductivity of the heat transfer medium, which is inversely proportional to the thermal resistivity of the heat transfer medium. In this connection, first through fourth heats $Q_1$-$Q_4$ can be characterized as being inversely proportional to first through fourth thermal resistances $R_{TH1}$-$R_{TH4}$ associated with first through fourth heats $Q_1$-$Q_4$. In the fully-confined array architecture of the cross-point memory array 10, contributions to first through fourth thermal resistances $R_{TH1}$-$R_{TH4}$ can originate from various regions connected to the first memory cell 30a. For example, regions that contribute to $R_{TH2}$ can include a bulk material of the top electrode 32a and a first interface between the top electrode 32a and the storage node 34a. Additionally, regions that contribute to $R_{TH2}$ can include the second interface between the storage node 34a and the bottom electrode 36a and a bulk material of the bottom electrode 36a. Additionally, regions that contribute to $R_{TH3}$ can include a third interface between the storage node 34a and adjacent inter-column dielectric region 48 as well as a bulk material of the inter-column dielectric region 48. Additionally, regions that contribute to $R_{TH4}$ can include a fourth interface between the storage node 34a and adjacent inter-column dielectric region 50 as well as a bulk material of the inter-column dielectric region 50. It is to be understood that while other regions may also contribute substantially to the overall thermal resistance surrounding storage node 34a, only first through fourth thermal resistances $R_{TH1}$-$R_{TH4}$ are discussed for clarity.

Excessive loss of heat in the x and y directions can also lead to thermal disturb of adjacent cells during programming a target cell (sometimes referred to as program disturb). A program disturb occurs when the heat generated by performing a SET operation or a RESET operation on the target memory cell results in a heat transfer to an adjacent memory cell (sometimes referred to as a victim cell) such that an adjacent cell in a RESET state at least partially transforms to a SET state. As a general rule, the time for phase transformation $t_{cryst}$ of a storage node at a given temperature T can be governed by an Arrhenius relationship (1).

$$t_{cryst} \propto \exp\left(\frac{E_A}{k_B T}\right)$$

where $E_a$ is the activation energy, kB is the Boltzmann constant, and T is the temperature of the victim cell. Due to the exponential nature of the crystallization kinetics, a small increase in the temperature of the victim cell can lead to a substantial degradation of program disturb time-to-fail. In addition, a time required to disturb a victim cell can be cumulative; i.e., while a single RESET operation having a RESET pulse duration of $t_{RESET}$ may not be sufficient to cause a significant program disturb, repetition of many RESET operations can result in a program disturb. In this connection, minimizing loss of third and fourth heats $Q_3$ and $Q_4$ in FIGS. 2A and 2B, which can be achieved by maximizing $R_{TH3}$ and $R_{TH4}$ discussed above, can lead to an improvement in program disturb performance of the cross-point memory array 10.

In the embodiment of FIG. 2A, the column line 20, top electrodes 32a and 32b, storage nodes 34a and 34b, bottom electrodes 36a and 36b, selector nodes 38a and 38b, and row lines 22 have first through sixth lateral dimensions in the y-direction $d_{1a}$, $d_{2a}$, $d_{3a}$, $d_{4a}$, $d_{5a}$, and $d_{6a}$, respectively. In addition, a seventh lateral dimension in the y-direction $d_{7a}$ represents a spacing between adjacent memory cells 30a and 30b. The first lateral dimension in the y-direction $d_{1a}$ represents a column length of column lines 20 of the cross-point memory array 10. In one embodiment, a substantially similar second through sixth lateral dimensions in the y-direction $d_{2a}$, $d_{3a}$, $d_{4a}$, $d_{5a}$, and $d_{6a}$, can result from patterning and etching within a single photo mask level a stack between and including the top electrodes 32a and 32b and row lines 22.

Similarly, in the embodiment of FIG. 2B, the column lines 20, top electrodes 32a and 32c, storage nodes 34a and 34c, bottom electrodes 36a and 36c, selector nodes node 38a and 38c, and row line 22 have first through sixth lateral dimensions in the x-direction $d_{1b}$, $d_{2b}$, $d_{3b}$, $d_{4b}$, $d_{5b}$, and $d_{6b}$, respectively. In addition, a seventh lateral dimension in the x-direction represents the spacing between adjacent memory cells 30a and 30c in the x-direction. The sixth lateral dimension in the x-direction dm represents a row length of row lines 22 in the cross-point memory array 10. In one embodiment, a substantially similar first through fifth lateral dimensions in the x-direction $d_{1b}$, $d_{2b}$, $d_{3b}$, $d_{4b}$, and $d_{5b}$ result from patterning and etching within a single photo mask level a stack between and including the columns 20 and storage nodes 32a and 32b.

The first lateral dimension in the y-direction $d_{1a}$ representing a column length is a function of the number of row lines M the column line 20 traverses in the y-direction. For example, in an array with M row lines where $d_{1a}$ represents the spacing between adjacent memory cells in the y-direction, $d_{1a}$ may be at least $(M \times d_{6a}) + (M \times d_{7a})$. Similarly, the sixth lateral dimension in the x-direction $d_{6b}$ representing a row length is a function of the number of column lines N the row line 22 traverses in the x-direction. For example, in an array with N column lines where $d_{7b}$ represents the spacing between adjacent memory cells in the x-direction, $d_{6b}$ may be at least $(N \times d_{1b}) + (N \times d_{7b})$.

In the fully-confined array architecture of the cross-point memory array 10 according to one embodiment, $d_{2a}$-$d_{6a}$ in FIG. 2A can be selected to be the range between about 40 nm and 60 nm, for example 50 nm. In another embodiment, $d_{2a}$-$d_{6a}$ can have dimensions selected to be the range between about 25 nm and 40 nm, for example 35 nm. In another embodiment, $d_{2a}$-$d_{6a}$ can have dimensions selected to be the range between about 18 nm and 25 nm, for example 20 nm. In yet another embodiment, $d_{2a}$-$d_{6a}$ can have dimensions selected to be the range between about 5 nm and 18 nm, for example 14 nm. Smaller dimensions are yet possible, limited only by the lithographic capability employed by the person skilled in the art. Similar ranges of dimensions can be chosen for $d_{1b}$-$d_{5b}$ in FIG. 2B.

According to the embodiments of FIGS. 2A and 2B, column lines 20 have a first thickness $h_1$, the top electrodes 32a-c have a second thickness $h_2$, the storage node 34a-c have a third thickness $h_3$, the bottom electrode 36a-c have a fourth thickness $h_4$, the selector nodes 38a-c have a fifth thickness $h_5$, and row lines 22 have a sixth thickness $h_6$. In one embodiment, the first thickness $h_1$ has a thickness selected to be the range between about 10 nm and 100 nm, for example 35 nm, the second thickness $h_2$ has a thickness selected to be the range between about 10 nm and 50 nm, for example 25 nm, the third thickness $h_3$ has a thickness selected to be the range between about 5 nm and 50 nm, for example 25 nm, and the fourth thickness $h_4$ has a thickness selected to be the range between about 10 nm and 100 nm, for example 25 nm. In embodiments where selector nodes 38a-c comprise chalcogenide materials of OTS switches, the fifth thickness $h_5$ has a thickness selected to be the range between about 5 nm and 50 nm, for example 25 nm, and the sixth thickness $h_6$ has a thickness selected to be the range between about 10 nm and 100 nm, for example 50 nm.

In connection with the discussion above, a person having ordinary skill in the art will understand that choosing materials coupled to storage nodes and selector nodes to optimize the performance of a memory cell with respect to their electrical resistances and thermal resistances can have tradeoffs. For example, in FIGS. 2A and 2B, choosing a metallic material to serve as top and bottom electrodes 32a and 36a of the storage node 34a can desirably reduce first and third LRS and FIRS resistances $R_{LRS1}$, $R_{LRS3}$, $R_{HRS1}$, and $R_{HRS3}$. However, such a choice can undesirably reduce first and second thermal resistances $R_{TH1}$ and $R_{TH2}$. Embodiments that minimize such tradeoffs are now disclosed herein.

Figure 3A:
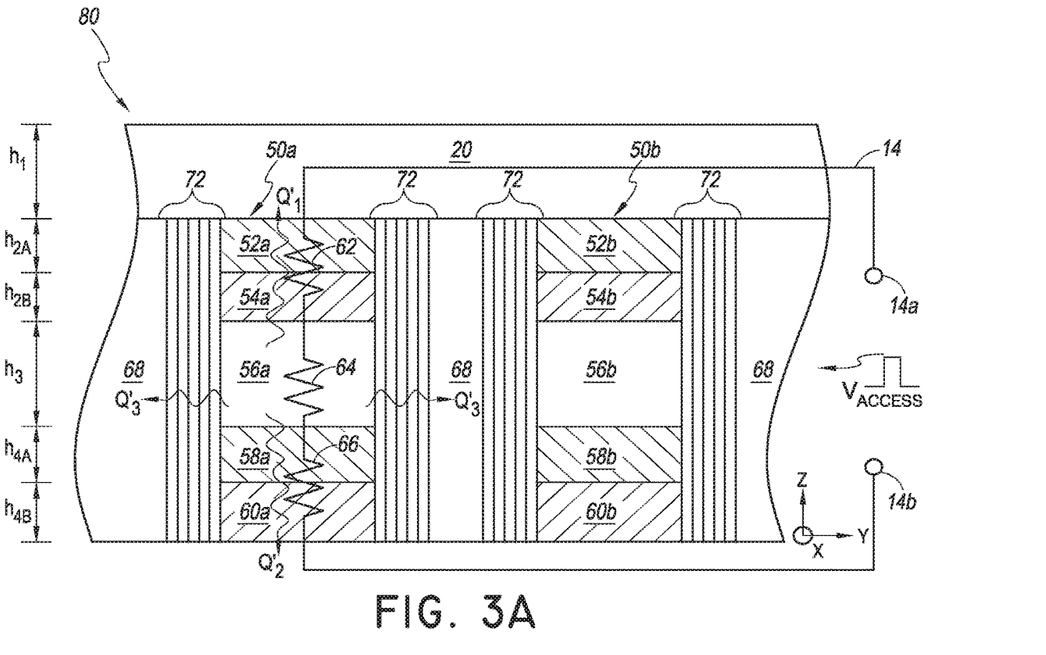
FIG. 3A is an illustration depicting a cross-section of a phase change memory cell taken along a column line according to another embodiment.
Figure 3B:
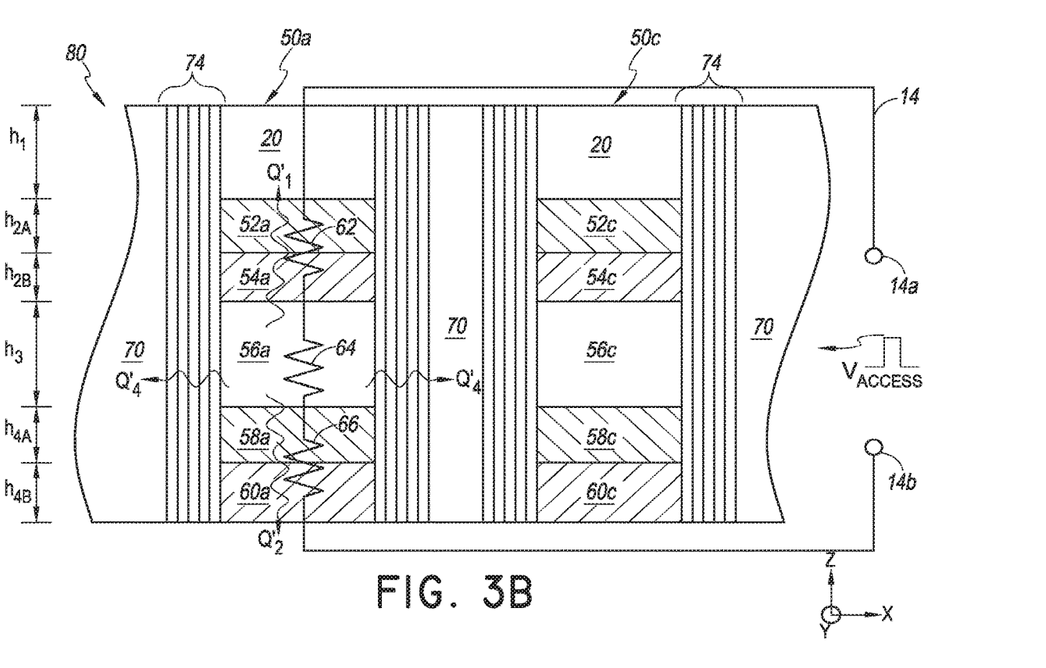
FIG. 3B is an illustration depicting a cross-section of a phase change memory cell taken along a row line according to another embodiment.

FIGS. 3A and 3B illustrate cross-sectional views of a portion of a cross point memory array 80 viewed from a direction parallel to the x-direction and the y-direction, respectively. The cross-point memory array 80 is configured as fully-confined array architecture described above. The cross sectional views are annotated with a circuit representation demonstrating relevant resistive elements during an access operation of a memory cell 50a as described above. Similar to the cross-point array 10 of FIGS. 2A and 2B, the cross-point array 80 includes memory cells disposed between column lines 20 and row lines 22.

According to the illustrated embodiment in FIGS. 3A and 3B, a memory cell includes a bottom electrode, a chalcogenide material element disposed on the bottom electrode, and a top electrode disposed on the chalcogenide material element. The top electrode includes a top thermally insulating region over the first electrode, where the thermally insulating region comprises carbon and has a first thermal resistivity. Top electrode additionally includes a top metallic contact region interposed between the chalcogenide material element and the thermally insulating region, where the metallic contact material has a second thermal resistivity lower than the first thermal resistivity.

Additionally, the chalcogenide material element has top and bottom surfaces and first and second sidewalls extending between top and bottom surfaces, and the memory cell further includes a plurality of sidewall thermal insulators formed over first and second sidewalls.

In particular, the cross-point memory array 80 of FIGS. 3A and 3B includes memory cells 50a-50c. Memory cells 50a-50c include bottom electrodes including bottom thermally insulating regions 60a-60c and bottom metallic contact regions 58a-58c disposed on row lines (not shown). In one embodiment, bottom thermally insulating regions 60a-60c are disposed on row lines 22 and may include carbon. Bottom thermally insulating regions 60a-60c can include carbon in various forms, including graphitic carbon, diamond-like carbon, and amorphous carbon, among others. Bottom thermally insulating regions 60a-60c including carbon can be formed using various processing techniques, including chemical vapor deposition, plasma-enhanced chemical vapor deposition, physical vapor deposition, among others.

In another embodiment, bottom metallic contact regions 58a-58c are disposed on thermally insulating regions 60a-60c and comprise metallic materials. Bottom metallic contact regions 58a-58c include suitable conductive and/or semiconductive materials including n-doped poly silicon and p-doped poly silicon, metals including Al, Cu, Ni, Cr, Co, Ru, Rh, Pd, Ag, Pt, Au, Ir, Ta, and W, conductive metal nitrides including TiN, TaN, WN, and TaCN, conductive metal silicides including tantalum silicides, tungsten silicides, nickel silicides, cobalt silicides, and titanium silicides, and conductive metal oxides including $RuO_2$.

In some embodiments, bottom thermally insulating regions 60a-60c are in direct contact with bottom metallic contact regions 58a-58c. In other embodiments, intervening regions may be present that can include materials in bottom thermally insulating regions 60a-60c and bottom metallic contact regions 58a-58c.

Additionally, memory cells 50a-50c include chalcogenide material elements 56a-56c disposed on bottom metallic contact regions 58a-58c. In one embodiment, chalcogenide material elements 56a-56c can be storage nodes described in connection with FIGS. 2A and 2B. In this embodiment, there can be selector nodes coupled elsewhere (not shown in FIGS. 3A and 3B), for example, coupled to bottom thermally insulating regions 60a-60c. Selector nodes can be part of various selector devices described above, including, for example, BJTs and OTSs. In another embodiment, chalcogenide material elements 56a-56c can be selector nodes described in connection with FIGS. 1, 2A, and 2B. In this embodiment, there can be storage nodes coupled elsewhere (not shown in FIGS. 3A and 3B), for example, coupled to bottom thermally insulating regions 60a-60c.

Additionally, memory cells 50a-50c include top electrodes including top thermally insulating regions 52a-52c and top metallic contact regions 54a-54c disposed on chalcogenide material elements 56a-56c. In one embodiment, top metallic contact regions 54a-54c are disposed on chalcogenide material elements 56a-56c and comprise metallic materials. Top metallic contact regions 54a-54c include suitable conductive and/or semiconductive materials similar to bottom metallic contact regions 58a-58c described above.

In another embodiment, top thermally insulating regions 52a-52c are disposed on top metallic contact regions 54a-54c and include carbon. Top thermally insulating regions 52a-52c can include carbon in similar forms and be formed using similar processing techniques as in bottom thermally insulating regions 60a-60c.

In some embodiments, bottom thermally insulating regions 60a-60c are in direct contact with bottom metallic contact regions 58a-58c. In other embodiments, intervening regions may be present that can include materials in bottom thermally insulating regions 60a-60c and bottom metallic contact regions 58a-58c.

In addition, in some embodiments, chalcogenide material elements 56a-56c can be in direct contact with one or both of top and bottom metallic contact regions 54a-54c and 58a-58c. In other embodiments, intervening regions may be present that can include materials in chalcogenide material elements 56a-56c and top and bottom metallic contact regions 54a-54c and 58a-58c.

According to the illustrated embodiment of FIG. 3A, chalcogenide material elements 56a and 56b have top and bottom surfaces and first and second sidewalls extending between top and bottom surfaces along the z-direction. In the fully-confined array architecture of the cross-point memory array 80, first and second sidewalls are separated in the y-direction by a distance spanning one cell dimension in the y direction (which is similar to the third lateral dimension in the x-direction $d_{3a}$ in FIG. 2A, not illustrated here for clarity). In this configuration, memory cells 50a and 50b include first sidewall thermal insulators 72 formed over first and second sidewalls. The first sidewall thermal insulators 72 includes a plurality of sidewall materials, e.g., sidewall layers 72-1 to 72-n (not labeled individually in FIG. 3A for clarity), to provide sufficient thermal insulation to improve programming efficiency of the chalcogenide material element of a target memory cell, and to provide improved immunity against program disturb, as discussed above in connection with FIGS. 2A and 2B. In the example embodiment of FIG. 3A, the chalcogenide material element of the target cell can be 56a, and the chalcogenide material element of the victim cell can be 56b adjacent to each other along a common column line 20. Each of the first sidewall thermal insulators 72 includes first through nth sidewall layers. In the illustrated example, by way of an example only, each of the first sidewall thermal insulators 72 includes first through fifth sidewall layers 72-1-72-5 on the first and second sidewalls, where the first sidewall layer 72-1 can be in contact with first and second sidewalls. According to one embodiment, first and second sidewall layers comprise first and second dielectric materials D1 and D2, where each of the first and second sidewall layers have an atomic element not included in the other sidewall layer. According to another embodiment, the sidewall layers can have an alternating arrangement, such that each of first, third, and fifth sidewall layers comprise D1 and each of second and fourth sidewall layers comprise D2 (i.e., D1/D2/D1/D2/D1). Other embodiments are possible, where each third through fifth sidewall layers 72c-72e can comprise third through fifth dielectric materials D3-D5 that can be one of D1 or D2 or other materials.

In one embodiment, each of the first through nth sidewall layers 72-1 to 72-n of first sidewall thermal insulators 72 can have a thickness ranging from about 1 to 10 nm, for instance about 2 nm. In another embodiment, each of the first through nth sidewall layers 72-1 to 72-n of the first sidewall thermal insulators 72 can have a thickness ranging from about 2 to 5 nm, for instance about 3.5 nm. In addition, in some embodiments, the thicknesses of sidewall layers 72-1 to 72-n are substantially the same. In other embodiments, the thicknesses of sidewall layers 72-1 to 72-n are substantially different from one another.

In one embodiment, first sidewall thermal insulators 72 can have 1 to 20 sidewall layers (i.e., n can be 1 to 20), for instance 10 sidewall layers. In another embodiment, first sidewall thermal insulators 72 can have 2 to 10 sidewall layers (i.e., n can be 2 to 10), for instance 6 sidewall layers. In yet another embodiment, first sidewall thermal insulators 72 can have 3 to 7 sidewall layers (i.e., n can be 3 to 7), for instance 5 sidewall layers.

In one embodiment, each of the first through nth sidewall layers of the first sidewall thermal insulators 72 can include oxides such as $SiO_2$, $ZrO_2$, $HfO_2$, $Al_2O_3$, NiO, $TiO_2$, $Ta_2O_5$, $ThO_2$, $HfSiO_4$, $ZrSiO_4$, $Mg_2SiO_4$, MgO, BeO, and oxides of lanthanide series, among other oxides. In another embodiment, each of the first through nth sidewall layers of the first sidewall thermal insulators 72 can include nitrides or carbides such as $Si3N_4$ and SiC, among other nitrides and carbides.

Each of the first through nth sidewall layers of first sidewall thermal insulators 72 can be formed using a suitable deposition technique. For example, the first through nth sidewall layers can be formed using various processing techniques, including atomic layer deposition, chemical vapor deposition, plasma-enhanced chemical vapor deposition, physical vapor deposition, among others. A person skilled in the art will understand that the choice of a processing technique depends on many factors, e.g., as the availability of the precursor material, feature size and/or aspect ratio of an opening through which the material to be deposited is to travel, cost, and conformality of the deposited material, among others.

FIG. 3B similarly illustrates chalcogenide material elements 56a and 56c having top and bottom surfaces and third and fourth sidewalls extending between top and bottom surfaces along the z-direction. In the fully-confined array architecture of the cross-point memory array 80, third and fourth sidewalls are separated in the x-direction by a distance spanning one cell dimension in the x direction (which is similar to the third lateral dimension in the x-direction dab in FIG. 2B, not illustrated here for clarity). In addition, third and fourth sidewalls are substantially perpendicular to first and second sidewalls. In this configuration, memory cells 50a and 50c include second sidewall thermal insulators 74 formed over third and fourth sidewalls. Similar to first sidewall thermal insulators 72, second sidewall thermal insulators 74 include a suitable number of sidewall materials, e.g., layers, to provide sufficient thermal insulation to improve programming efficiency of the chalcogenide material element of a target memory cell, and to provide improved immunity against program disturb, as discussed above in connection with FIGS. 2A and 2B. In the example embodiment of FIG. 3B, the chalcogenide material element of the target cell can be 56a, and the chalcogenide material element of the adjacent victim cell can be 56c along a common row line 22. Each of the second sidewall thermal insulators 74 includes (n+1)th through mth sidewall layers (not labeled individually in FIG. 3B for clarity). In the illustrated example, by way of an example only, each of the second sidewall thermal insulators 74 includes sixth through tenth sidewall layers 74-6 to 74-10 on third and fourth sidewalls, where the sixth sidewall layer 74-6 can be in contact with third and fourth sidewalls. The materials, thicknesses, and the number of (n+1)th through mth sidewall layers of the second sidewall thermal insulators 74 can be similar to those described for first sidewall thermal insulators 72. In addition, the sidewall layers of the second sidewall thermal insulators 74 can be formed using similar techniques as those described for first sidewall thermal insulators 72.

A person skilled in the art will understand that a choice of certain material combinations for different regions of the memory cell and the array can be made to optimize certain aspects of the performance of the memory cell. These aspects are discussed by referring to a circuit path 14. In the fully-confined array architecture of the cross-point memory array 80 in FIGS. 3A and 3B, the memory cell 50a may be accessed in a bit-addressable mode by application of an access voltage $V_{ACCESS}$ across the a first terminal 14a and a second terminal 14b of the access circuit path 14. The first and second terminals can represent an nth column 20 and a mth row 22. $V_{ACCESS}$ and the associated current $I_{ACCESS}$ will result in energy dissipation at various points along the access circuit path 14.

The access circuit path 14 includes first through third resistors 62, 64, and 66 connected in electrical series between first and second terminals 14a and 14b. Similar to the access circuit path 12 in FIGS. 2A and 2B, the first through third resistors 62, 64, and 66 can have first through third LRS resistances $R'_{LRS1}$, $R'_{LRS2}$, and $R'_{LRS3}$ and FIRS resistances $R'_{HRS1}$, $R'_{HRS2}$, and $R'_{HRS3}$. Contributions to LRS and HRS resistances can originate from various regions across the memory cell 50a, which is a target memory cell in this example. For example, regions that contribute to $R'_{LRS1}$ and $R'_{HRS1}$ can include a bulk material of the top thermally insulating region 52a, a bulk material of the top metallic contact region 54a, and a first interface between the top metallic contact region 54a and the storage node 56a. Additionally, regions that contribute to $R'_{LRS2}$ and $R'_{HRS2}$ can include a bulk material of the storage node 56a. Additionally, regions that contribute to $R'_{LRS3}$ and $R'_{HRS3}$ can include a second interface between the storage node 56a and the bottom metallic contact region 58a, a bulk material of the bottom metallic contact region 58a, and a bulk material of the bottom thermally insulating region 60a. It is to be understood that while other regions may also contribute substantially to the overall resistance between the first and second terminals 14a and 14b, only first through third resistors 62, 64, and 66 are represented in the access circuit path 14 for clarity. In addition, other circuit paths can exist, for example, through the second memory cell 50b, which are not shown nor discussed for clarity.

In the illustrated embodiment of FIGS. 3A and 3B, by choosing a suitable material for the top metallic contact region 54a as discussed above, the contribution of the first interface between the top electrode and the storage node 56a to $R'_{LRS1}$ and $R'_{HRS1}$ can be substantially reduced compared to embodiments that do not include the top metallic contact region 54a. Similarly, by choosing a suitable material for the bottom metallic contact region 58a as discussed above, the contribution of the second interface between the bottom electrode and the storage node 56a to $R'_{LRS3}$ and $R'_{HRS3}$ can be substantially reduced compared to embodiments that do not include the bottom metallic contact region 58a. This is because interfaces formed by top and bottom thermally insulating regions 52a and 60a in contact with the chalcogenide material element 56a can have substantially higher contact resistances compared interfaces formed by top and bottom metallic contact regions 54a and 58a in contact with the chalcogenide material element 56a.

In one embodiment, the contribution of interfacial resistances of first and second interfaces to first and third LRS resistances $R'_{LRS1}$ and $R'_{LRS3}$ and first and third FIRS resistances $R'_{HRS1}$ and $R'_{HRS3}$ is below about $1 \times 10^{-6}$ Ohm cm$^2$. In another embodiment, the contribution of interfacial resistances of first and second interfaces to first and third LRS resistances $R'_{LRS1}$ and $R'_{LRS3}$ and first and third FIRS resistances $R'_{HRS1}$ and $R'_{HRS3}$ is below about $1 \times 10^{-7}$ Ohm cm$^2$. In yet another embodiment, the contribution of interfacial resistances of first and second interfaces to first and third LRS resistances $R'_{LRS1}$ and $R'_{LRS3}$ and first and third HRS resistances $R'_{HRS1}$ and $R'_{HRS3}$ is below about $5 \times 10^{-8}$ Ohm cm$^2$.

By reducing contributions of first and second interfaces to LRS and FIRS resistances as described above in the embodiment of FIGS. 3A and 3B, a higher ON/OFF ratio can be achieved. This is because as discussed above, the ON/OFF ratio can be proportional to the ratio $(R'_{HRS1}+R'_{HRS2}+R'_{HRS3})/(R'_{LRS1}+R'_{LRS2}+R'_{LRS3})$, and when $R'_{HRS2} \gg R'_{HRS1}+R'_{HRS3}$ and $R'_{LRS2} \gg R'_{LRS1}+R'_{LRS3}$, the ON/OFF ratio can be dominated by the ratio $R'_{HRS2}/R'_{LRS2}$. Under this circumstance, the ON/OFF ratio can be desirably dominated by the resistance values of the bulk resistance of the storage node 56a in SET and RESET states. Thus, from an ON/OFF ratio point of view, an implementation exemplified in FIGS. 3A and 3B can desirably have relatively low LRS and FIRS resistances $R'_{LRS1}$, $R'_{HRS1}$, and $R'_{HRS3}$ of the first and third resistors 62 and 66 and relatively high LRS and FIRS resistances $R'_{LRS2}$ and $R'_{HRS2}$ of the second resistor 64.

Additionally, in the illustrated embodiment of FIGS. 3A and 3B, by choosing a suitable material for the top metallic contact region 54a as discussed above, higher energy efficiencies of SET and RESET operations can also be achieved. This is because it may be desirable to have self-heating of the storage node dominate over heats generated in other regions. From this standpoint, it may be desirable to have $R'_{HRS2} \gg R'_{HRS1}+R'_{HRS3}$ and $R'_{LRS2} \gg R'_{LRS1}+R'_{LRS3}$. When a voltage $V_{ACCESS}$ is applied between the first and second terminals 14a and 14b of the access circuit path 14, voltages proportional to respective LRS and HRS resistances can drop across first, second, and third resistors 62, 64, and 66. In particular, when $V_{ACCESS}=V_{RESET}$ is applied between the first and second terminals 14a and 14b, first, second, and third voltages $V'_{RESET1}$, $V'_{RESET2}$, and $V'_{RESET3}$ can drop across first, second, and third resistors 62, 64, and 66, respectively. In addition, the resulting current $I_{RESET}=V_{RESET}/(R'_{LRS1}+R'_{LRS2}+R'_{LRS3})$ can result in generation of first, second, and third RESET heats $Q'_{RESET1}=I_{RESET}^2 R'_{LRS1}$ and $Q'_{RST2}=I_{REST}^2 R'_{LRS2}$, and $Q'_{RST3}=I_{RESET}^2 R'_{LRS3}$, respectively. Thus, by having $R'_{LRS2} \gg R'_{LRS1}+R'_{LRS3}$, more of the access energy is spent on self-heating the chalcogenide material element 56a compared to the interfaces.

Similarly, when $V_{ACCESS}=V_{SET}$ is applied between the first and second terminals 14a and 14b, first, second, and third voltages $V'_{SET1}$, $V'_{SET2}$, and $V'_{SET3}$ can drop across first, second, and third resistors 62, 64, and 66, respectively. In addition, the resulting current $I_{SET}=V_{SET}/(R'_{HRS1}+R'_{HRS2}+R'_{HRS3})$ can Result in the Generation of First, Second, and Third SET heats $Q'_{SET1}=I_{SET}^2=I_{SET}^2 R'_{HRS1}$ and $Q'_{SET2}=I_{SET}^2 R'_{HRS2}$, and $Q'_{SET3}=I_{SET}^2 R'_{HRS3}$, respectively. Thus, by having $R'_{HRS2} \gg R'H_{HRS1}+R'_{HRS3}$, more of the access energy is spent on heating the chalcogenide material element 56a versus the interfaces.

Furthermore, in the illustrated embodiment of FIGS. 3A and 3B, by choosing a suitable material for top and bottom insulating regions 52a and 60a and for first and second sidewall thermal insulators 72 and 74 as discussed above still higher energy efficiency of SET and RESET operations can be achieved by more efficiently confining the heat generated in the storage node in response to dissipation of power during SET and RESET operations. As illustrated in FIGS. 3A and 3B, there can be heat loss in six directions. A first heat $Q'_1$ can be lost from the storage node 56a in the z-direction towards the column line 20. A second heat $Q'_2$ can be lost from the storage node 56a in the z-direction towards the row line 22. A third heat $Q'_3$ can be lost from the storage node 56a in opposite y-directions towards adjacent storage nodes 56b and 56h (not shown). A fourth heat $Q'_4$ can be lost from the storage node 56a in opposite x-directions towards adjacent storage nodes 54c and 54e (not shown).

First through fourth heats $Q'_1$-$Q'_4$ can be characterized as being inversely proportional to first through fourth thermal resistances array architecture of the cross-point memory array 80, contributions to first through fourth thermal resistances $R'_{TH1}$-$R'_{TH4}$ can originate from various regions connected to the memory cell 50a, which can be a target memory cell. For example, regions that contribute to $R'_{TH1}$ and $R'_{TH2}$ can include bulk materials of the top and bottom thermally insulating regions 52a and 60a. Thus, by choosing a suitable material for top and bottom insulating regions 52a and 60a, e.g., a carbon-based material, $Q'_1$ and $Q'_2$ can be substantially reduced compared to embodiments that do not include top and bottom insulating regions 52a and 60a.

In this connection, choosing materials having suitable thermal resistivities can be important for minimizing $Q'_1$ and $Q'_2$. In one embodiment, a first ratio of the thermal resistivity corresponding to top thermally insulating regions 52a-52c and the thermal resistivity corresponding to top metallic contact regions 54a-54c has a range between about 1 and 500. In another embodiment, the first ratio has a range between about 1 and 200. In yet another embodiment, the first ratio has a range between about 10 and 50. Similarly, a second ratio of the thermal resistivity corresponding to bottom thermally insulating regions 60a-60c and the thermal resistivity corresponding to bottom metallic contact regions 58a-58c can have similar ranges and values as the first ratio.

Additionally, regions that contribute to $R'_{TH3}$ can include interfaces and bulk materials formed between the storage node 56a and sidewall layers 72-1 to 72-n of first sidewall thermal insulators 72. Similarly, regions that contribute to $R'_{TH4}$ can include interfaces and bulk materials formed between the storage node 56a and sidewall layers 74-(n+1) to 72m of second sidewall thermal insulators 74. Thus, by choosing suitable materials and numbers of sidewall layers for first and second sidewall thermal insulators 72 and 74 as discussed above, $Q'_3$ and $Q'_4$ can be substantially reduced compared to embodiments that do not include first and second sidewall thermal insulators 72 and 74.

A person skilled in the art will understand that having first and second sidewall thermal insulators 72 and 74 including a plurality sidewall layers can increase $R'_{TH3}$ and $R'_{TH4}$ by more than a mere linear sum proportional to thicknesses and thermal resistance values of the individual layers. This is because the presence of interfaces can increase the thermal resistance independently of the bulk material. For example, having first and second sidewall layers of first and second dielectric materials having a combined first thickness can have lower thermal resistance compared to first through tenth sidewall layers of alternating first and second dielectric materials having a combined second thickness equal to the first thickness.

Similarly, higher $R'_{TH3}$ and $R'_{TH4}$ resulting from having first and second sidewall thermal insulators 72 and 74 can reduce program disturb of adjacent cells. As discussed above in connection with FIGS. 2A and 2B, program disturb of adjacent cells depend on the increased temperature of the adjacent victim cell induced by programming a target cell. In this connection, minimizing loss of third and fourth heats $Q'_3$ and $Q'_4$ in FIGS. 3A and 3B, which can be achieved by maximizing $R'_{TH3}$ and $R'_{TH4}$ discussed above, can lead to an improvement in program disturb performance of the cross-point memory array 80.

According to the embodiments of FIGS. 3A and 3B, column lines 20 have a first thickness h1 and the storage node 56a-c have a third thickness $h_3$ similar to the first and third thicknesses of FIGS. 2A and 2B. In addition, top thermally insulating regions 52a-c and top metallic contact regions 54a-c have thicknesses $h_{2A}$ and $h_{2B}$, respectively. In addition, bottom metallic contact regions 58a-c and bottom thermally insulating regions 60a-c have thicknesses $h_{4A}$ and $h_{4B}$, respectively. In one embodiment, each of the thicknesses $h_{2A}$ and $h_{4B}$ of top and bottom thermally insulating regions 52a-c and 60a-c can be selected to be in the range between 10 and 50 nm. In another embodiment, each of the thicknesses $h_{2A}$ and $h_{4B}$ of top and bottom thermally insulating regions 52a-c and 60a-c can be selected to be in the range between 20 and 30 nm. In one embodiment, each of the thicknesses $h_{2B}$ and $h_{4A}$ of top and bottom metallic contact regions 54a-c and 58a-c can be selected to be in the range between 5 and 30 nm. In another embodiment, each of the thicknesses $h_{2B}$ and $h_{4A}$ of top and bottom metallic contact regions 54a-c and 58a-c can be selected to be in the range between 10 and 20 nm. Other dimensions not illustrated, for example the fifth thickness $h_5$ and the sixth thickness $h_6$ can be similar to the dimensions discussed above in connection with FIGS. 2A and 2B.

Figure 4A:
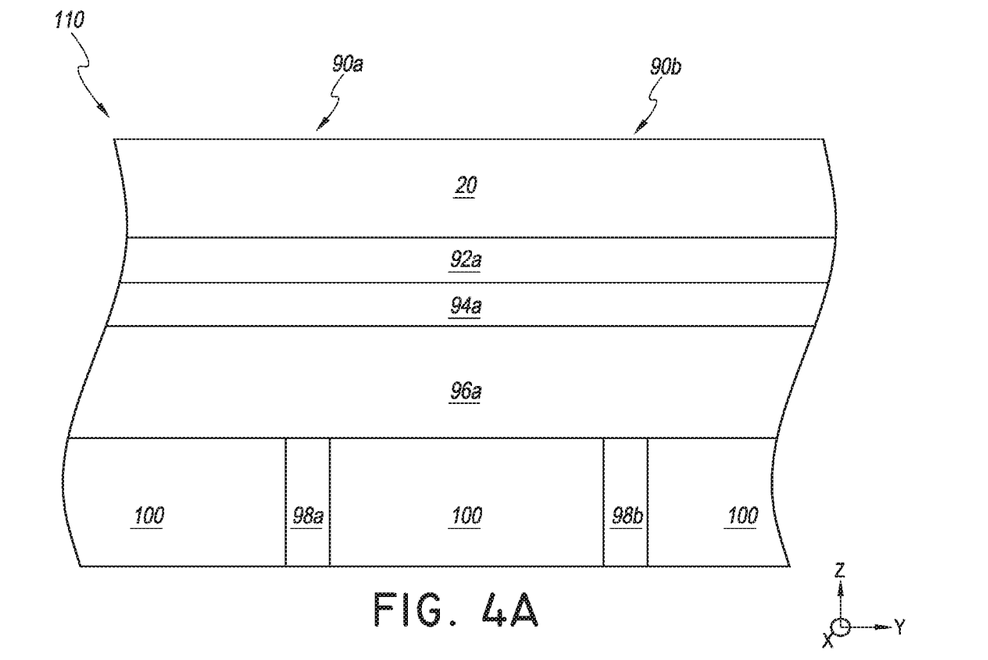
FIG. 4A is an illustration depicting a cross-section of a phase change memory cell taken along a column line according to another embodiment.
Figure 4B:
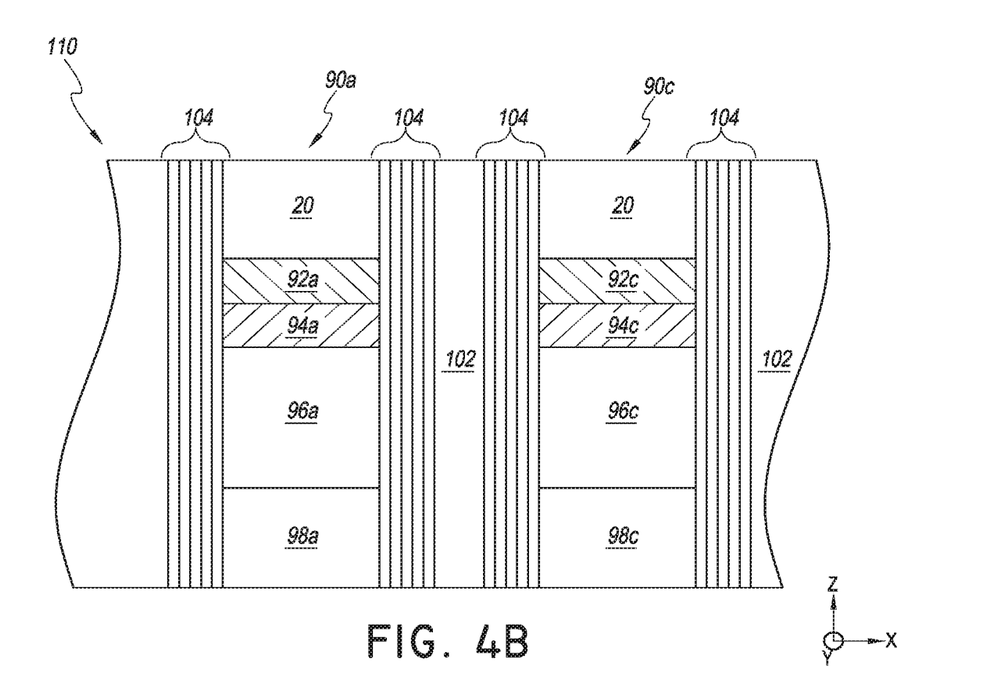
FIG. 4B is an illustration depicting a cross-section of a phase change memory cell taken along a row line according to another embodiment.

FIGS. 4A and 4B illustrate cross-sectional views of a portion of a cross point memory array 110 viewed from a direction parallel to the x-direction and the y-direction, respectively, according to another embodiment. Similar to the cross-point array 80 of FIGS. 3A and 3B, the cross-point array 110 includes memory cells disposed between column lines 20 and row lines 22. In contrast to the fully-confined array architecture described above in connection with FIGS. 3A and 3B, the array architecture in FIGS. 4A and 4B has a top thermally insulating region, a top metallic contact region, and a chalcogenide material element forming a continuous line along with the column line 20. In addition, the array architecture in FIGS. 4A and 4B has bottom electrodes forming a thin wall structure extending in the row direction. The array architecture is referred to herein as a wall array architecture.

According to the illustrated embodiment in FIGS. 4A and 4B, a memory cell includes a bottom electrode, a chalcogenide material element disposed on the bottom electrode, and a top electrode disposed on the chalcogenide material element. The top electrode includes a top thermally insulating region over the first electrode, where the thermally insulating region comprises carbon and has a first thermal resistivity. Top electrode additionally includes a top metallic contact region interposed between the chalcogenide material element and the thermally insulating region, where the metallic contact layer has a second thermal resistivity lower than the first thermal resistivity.

Additionally, the chalcogenide material element has top and bottom surfaces and first and second sidewalls extending between top and bottom surfaces, and the memory cell further includes a plurality of sidewall thermal insulators formed over first and second sidewalls.

The cross-point memory array 110 of FIGS. 4A and 4B includes memory cells 90a-90c. Memory cells 90a-90c include bottom electrodes 98a and 98b disposed on row lines (not shown). Bottom electrodes 98a and 98c in FIG. 4B form a thin wall extending in the x-direction having a wall length similar to the fourth lateral dimension in the x-direction d4b corresponding to the bottom electrodes 36a and 36c in FIG. 2B. However, unlike FIG. 2B, the bottom electrodes 98a and 98b in FIG. 4A have a wall thickness substantially thinner than the fourth lateral dimension in the y-direction $d_{4a}$ corresponding to the bottom electrodes 36a and 36b in FIG. 2A. The wall thickness can be any suitable thickness substantially less than the fourth lateral dimension $d_{4a}$ and chosen to dissipate sufficient energy to as a heater for changing the phase of the chalcogenide material element during either one or both of SET and RESET operations. For example, in one embodiment, the wall thickness is between about 10% and about 50% of the fourth lateral dimension $d_{4a}$. In another embodiment, the wall thickness is between about 20% and about 40% of the fourth lateral dimension $d_{4a}$, for instance about 25%. Due to the thin wall configuration, the bottom electrodes 98a-98c dissipates a substantial amount of energy in both SET and RESET operations and can function as a heater for the chalcogenide material element.

Additionally, in contrast to the fully-confined array architecture described above in connection with FIGS. 3A and 3B, the wall array architecture in FIGS. 4A and 4B has chalcogenide material elements 96a and 96c disposed on bottom electrodes 98a and 98c, top metallic contact regions 94a and 94c disposed on chalcogenide material elements 96a and 96c, and top thermally insulating regions 92a and 92c disposed on metallic contact regions 94a and 94c. In this embodiment, chalcogenide material elements 96a and 96c, top metallic contact regions 94a and 94c, and top thermally insulating regions 92a and 92c form continuous lines along with the column line 20. In one embodiment, chalcogenide material elements 96a-96c can be storage nodes In this embodiment, there can be selector nodes coupled elsewhere (not shown in FIGS. 4A and 4B), for example, coupled to bottom electrodes 98a-98c. The selector nodes can be part of various selector devices described above, including, for example, BJTs and OTSs.

Top metallic contact regions 94a-94c include suitable conductive and semiconductive materials similar to top metallic contact regions of FIGS. 3A and 3B. In addition, top thermally insulating regions 92a-92c can include carbon in similar forms as in top thermally insulating regions of FIGS. 3A and 3B, and can be formed using similar processing techniques.

According to the illustrated embodiment of FIG. 4B, chalcogenide material elements 96a and 96c have top and bottom surfaces and first and second sidewalls extending between top and bottom surfaces along the z-direction. In the wall array architecture of the cross-point memory array 110, first and second sidewalls extend in the y-direction to span one column line dimension in the y direction (which is similar to the first lateral dimension in the y-direction $d_{1a}$ in FIG. 2A, not illustrated here for clarity). In this configuration, memory cells 90a and 90b include a plurality of first sidewall thermal insulators 104 formed over first and second sidewalls. Similar to FIG. 3B, the plurality of first sidewall thermal insulators 104 includes a suitable number of layers to provide sufficient thermal insulation to improve programming efficiency of the chalcogenide material element of a target memory cell, and to provide improved immunity against program disturb, as discussed above in connection with FIGS. 2A and 2B. In the example embodiment of FIG. 4B, the chalcogenide material element of the target cell can be 96a, and the chalcogenide material element of the victim cell can be 96b along a common row line 22 (not shown). Each of the first sidewall thermal insulators 104 can include first through nth sidewall layers, similar to as discussed in FIGS. 3A and 3B. In addition, the materials, thicknesses, and the number of first through nth sidewall layers of the first sidewall thermal insulators 104 can be similar to those described for the first sidewall thermal insulators in FIGS. 3A and 3B. In addition, the sidewall layers of the second sidewall thermal insulators 104 can be formed using similar techniques as those described for the first sidewall thermal insulators in FIGS. 3A and 3B.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A device comprising:
   a selector node;
   a first electrode in contact with the selector node;
   a storage node in contact with the first electrode;
   a second electrode in contact with the storage node; and a sidewall insulator in contact with the selector node, the first electrode, the storage node, and the second electrode.

2. The device of claim 1, wherein the first electrode is configured to electrically couple the storage node with the selector node.

3. The device of claim 1, wherein the sidewall insulator comprises a dielectric material.

4. The device of claim 1, wherein the sidewall insulator extends between a top and bottom surface of the device and is adjacent to each of the selector node, the first electrode, the storage node, and the second electrode.

5. The device of claim 1, further comprising:
an interface between the first electrode and the storage node, the interface having a resistivity different from a resistivity of the first electrode.

6. The device of claim 1, further comprising:
an interface between the storage node and the second electrode, the interface having a resistivity different from a resistivity of the second electrode.

7. The device of claim 1, further comprising:
an access line coupled with and in contact with the second electrode.

8. The device of claim 1, wherein the selector node and the storage node have a same nominal width in a first direction.

9. The device of claim 1, wherein the first electrode and the second electrode have a same nominal width in a first direction.

10. A device comprising:
a first electrode;
a chalcogenide material element in contact with the first electrode;
a second electrode in contact with the chalcogenide material element, wherein the second electrode comprises a thermally insulating carbon region and a metallic contact region between the chalcogenide material element and the thermally insulating carbon region; and
an access line extending in a first direction, wherein the access line, the chalcogenide material element, and the second electrode have a same nominal width in a second direction different from the first direction.

11. The device of claim 10, wherein the access line, the chalcogenide material element, and the second electrode have a same nominal width in a third direction, different from the first direction.

12. The device of claim 10, wherein the first electrode has a nominal width less than a nominal width of the chalcogenide material element in the first direction.

13. The device of claim 10, wherein the first electrode and the chalcogenide material element have a same nominal width in the second direction.

14. The device of claim 10, wherein the second direction is perpendicular to the first direction.

15. A device comprising:
a first electrode comprising a thermally insulating carbon region;
a storage node in contact with the first electrode;
a second electrode in contact with the storage node; and
an access line coupled with the second electrode and extending in a first direction, wherein the access line, the storage node, and the second electrode have a same nominal width in a second direction different from the first direction.

16. The device of claim 15, further comprising:
a sidewall insulator adjacent to the storage node, wherein the sidewall insulator comprises a dielectric material.

17. The device of claim 16, wherein the access line has a nominal width greater than a nominal width of the second electrode in the first direction.

18. The device of claim 15, wherein the access line is in contact with the second electrode.

19. The device of claim 15, wherein the second direction is perpendicular to the first direction.

* * * * *